(12) United States Patent
Nease

(10) Patent No.: US 6,577,688 B1
(45) Date of Patent: Jun. 10, 2003

(54) HOST REJECTION FILTERING IN A DIGITAL AUDIO BROADCASTING SYSTEM

(75) Inventor: Greg Alan Nease, East Windsor, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/430,948

(22) Filed: Nov. 1, 1999

(51) Int. Cl.[7] .................................................. H04N 5/38
(52) U.S. Cl. ........................ 375/350; 370/487; 370/529; 348/729; 348/731; 348/607
(58) Field of Search ................................. 375/324, 340, 375/345, 350; 348/729, 731, 725, 554, 607; 370/487, 529

(56) References Cited

U.S. PATENT DOCUMENTS

| | | | | |
|---|---|---|---|---|
| 6,125,269 A | * | 9/2000 | Brekelmans | 455/180.1 |
| 6,154,505 A | * | 11/2000 | Konishi et al. | 348/729 |
| 6,246,698 B1 | * | 6/2001 | Kumar | 370/487 |
| 6,426,780 B1 | * | 7/2002 | Limberg et al. | 348/21 |

OTHER PUBLICATIONS

B. W. Kroeger and A.J. Vigil, "Improved IBOC DAB Technology for AM and FM Broadcasting," SBE Engineering Conference, pp. 1–10, 1996.

B. W. Kroeger and D. Cammarata, "Robust Modem and Coding Techniques for FM Hybrid IBOC DAB," IEEE Transactions on Broadcasting, vol. 43, No. 4, pp. 412–420, Dec. 1997.

B. W. Kroeger and P.J. Peyla, "Compatibility of FM Hybrid In–Band On–Channel (IBOC) System for Digital Audio Broadcast," IEEE Transactions on Broadcasting, vol. 43, No. 4, pp. 421–430, Dec. 1997.

* cited by examiner

Primary Examiner—Amanda T. Le

(57) ABSTRACT

A digital receiver for receiving an analog host signal with one or more digital sidebands includes a bandreject filter arranged at least in part in an intermediate frequency (IF) processing stage of the receiver. In an illustrative embodiment, first and second digital sidebands are transmitted on either side of a frequency modulated (FM) analog host signal in a hybrid in-band on-channel (HIBOC) digital audio broadcasting (DAB) system. The received composite signal is filtered in the IF processing stage of the receiver by the bandreject filter in order to substantially attenuate the analog host signal while passing the digital sidebands. The bandreject filter may be arranged in the IF processing stage so as to filter the analog host signal from the composite signal at a point prior to an input of an automatic gain control (AGC) circuit, such that the AGC operating point is determined primarily by the digital sidebands. The bandreject filter may have a group delay characteristic for a portion of a frequency spectrum associated with the digital sidebands that is selected to equalize a corresponding group delay characteristic for a signal path of the receiver.

20 Claims, 6 Drawing Sheets

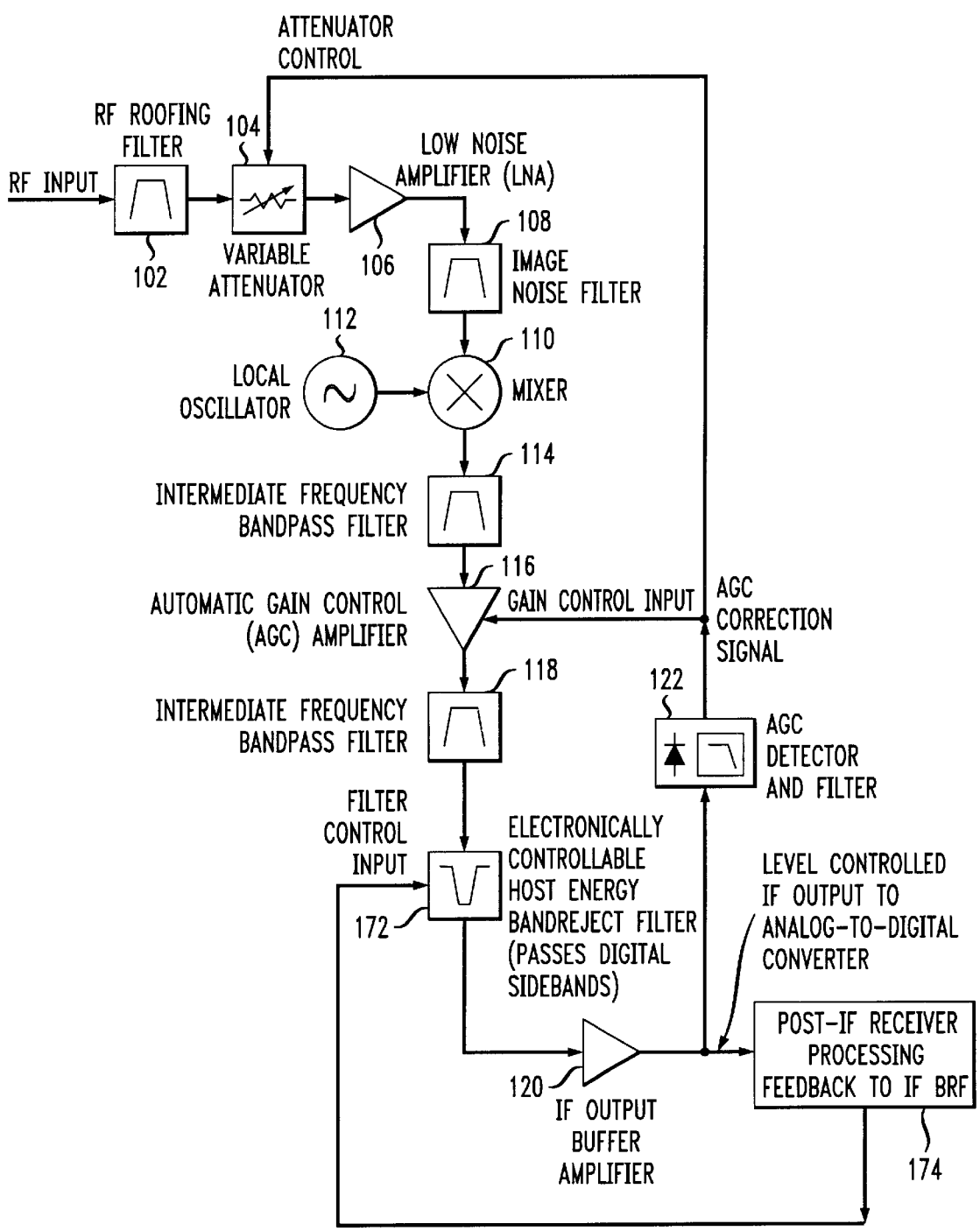

HOST REJECTION FILTERING IN A DIGITAL AUDIO BROADCASTING SYSTEM

FIELD OF THE INVENTION

The present invention relates generally to filtering techniques for use in communication system receivers, and more particularly to analog host signal filtering in a digital audio broadcasting (DAB) system receiver or other type of communication system receiver.

BACKGROUND OF THE INVENTION

Proposed systems for providing digital audio broadcasting (DAB) in the frequency modulated (FM) radio band are expected to provide near CD-quality audio, data services, and more robust coverage than existing analog FM transmissions. However, until such time as a transition to all-digital DAB can be achieved, broadcasters require an intermediate solution in which the analog and digital signals can be transmitted simultaneously within the same licensed band. Such systems are typically referred to as hybrid, in-band on-channel (HIBOC) DAB systems, and are being developed for both the FM and AM radio bands.

In order to prevent significant distortion in conventional analog FM receivers, the digital signal in a typical FM HIBOC DAB system is, e.g., transmitted in two sidebands, one on either side of the analog FM host signal. Current Federal Communications Commission (FCC) regulations require that the digital signal be transmitted at a power level 25 dB below the host signal. The analog and digital signals thus coexist with very little frequency separation, and in fact may overlap occasionally, depending on the nature of the analog modulation components. For a receiver designed to receive only the digital signal information, it is a relatively straightforward matter to remove most of the host FM signal energy from the received signal through conventional digital filtering techniques. However, this digital filtering can significantly increase the cost and complexity of the receiver. Furthermore, since all digital filtering must be done post-analog-to-digital converter (post-ADC), the ADC must be capable of handling the full dynamic range of the analog and digital signal components. This increases the required performance level of the ADC and thus its cost.

A number of conventional analog filtering techniques provide selective rejection by filtering of an on-channel interferer in a radio communications system. For example, wideband code division multiple access (CDMA) personal communication services (PCS) systems use a bandreject filter at the receiver to selectively remove narrowband interference that spectrally overlaps the desired received signal. This filter may be tunable or fixed in frequency. Although the filter also removes some of the desired signal information, this information is recoverable due to redundancy in the transmitted signal. However, these and other conventional analog filtering techniques are not readily applicable to the above-described HIBOC systems. A need therefore exists for improved analog filtering techniques suitable for use in HIBOC systems, so as to avoid the increased cost and complexity commonly associated with digital filtering.

SUMMARY OF THE INVENTION

The present invention provides methods and apparatus for processing received information in digital audio broadcasting (DAB) systems and other communication system applications. In an illustrative embodiment, first and second digital sidebands are transmitted on either side of a frequency modulated (FM) analog host signal in a hybrid in-band on-channel (HIBOC) DAB system. A digital receiver which receives the analog host signal and digital sidebands includes a bandreject filter arranged at least in part in an intermediate frequency (IF) processing stage of the receiver. The received composite signal is filtered in the IF processing stage of the receiver by the bandreject filter in order to substantially attenuate the analog host signal while passing the digital sidebands. The bandreject filter may be, e.g., a unitary bandreject filter implemented at a single point in the IF processing stage of the receiver, or a distributed bandreject filter implemented with multiple sections at a plurality of points in a signal path of the receiver.

In accordance with the invention, the bandreject filter may be arranged in the IF processing stage so as to filter the analog host signal from the composite signal at a point prior to an input of an automatic gain control (AGC) circuit, such that the AGC operating point for the receiver is determined primarily by the digital sidebands. For example, the bandreject filter may be arranged in the IF processing stage between an output of an IF buffer amplifier and an input of the AGC circuit, such that the AGC operating point is determined primarily by the digital sidebands. As another example, the bandreject filter may be arranged in the IF processing stage between an output of an IF bandpass filter and an input of an IF buffer amplifier, such that the AGC point is again determined primarily by the digital sidebands.

Numerous other configurations are also possible. For example, the bandreject filter may alternatively be arranged in the IF processing stage between an output of the IF buffer amplifier and an input of an analog-to-digital conversion (ADC) circuit, with an input of the bandreject filter coupled to a point which is between the output of the IF buffer amplifier and the input of the ADC circuit but after a point which drives an input of the AGC circuit, such that the AGC operating point is determined primarily by the analog host signal. In this case, although the AGC operating point setting is determined primarily by the analog host signal, the digital signal-to-interference ratio and dynamic range utilization of the ADC circuit is improved.

In accordance with another aspect of the invention, the bandreject filter may have a group delay characteristic for a portion of a frequency spectrum associated with the digital sidebands that is selected to equalize a corresponding group delay characteristic for a signal path of the receiver. In other words, the bandreject filter serves not only to provide rejection of analog host signal energy, but also to assist in providing a desired overall group delay performance for the corresponding signal path of the receiver.

One or more characteristics of the bandreject filter may be adjusted based on feedback from a back end digital signal processing element in the receiver. In addition, the bandreject filter may be selectively adjusted, e.g., tuned out of or otherwise electronically removed from the IF processing stage of the receiver, in order to permit reception of the analog host signal.

Advantageously, the invention allows AGC circuitry in the receiver to use the digital sideband signal, rather than the analog host signal, to set the dynamic range of the receiver. Allowing the digital signal to have a greater effect on the setting of the AGC operating point enhances the performance of the digital demodulation process in the receiver, particularly in the presence of multipath reception conditions. In addition, the invention reduces the need for post- ADC host rejection filtering, thereby simplifying the signal processing performance requirements in the receiver back end.

The invention can be applied to other types of digital information, including, for example, data, video and image information. In addition, the invention may be implemented in numerous applications other than FM HIBOC DAB systems, such as Internet and satellite broadcasting systems, systems for simultaneous delivery of audio and data, etc.

BRIEF DESCRIPTION OF THE DRAWINGS

FIG. 7 shows an illustrative embodiment of an FM HIBOC receiver in which bandreject filter characteristics are controlled in accordance with feedback from a post-IF processing stage.

DETAILED DESCRIPTION OF THE INVENTION

The invention in the illustrative embodiment to be described below provides host rejection filtering for an exemplary frequency modulated (FM) hybrid in-band on-channel (HIBOC) digital audio broadcasting (DAB) system. It should be understood, however, that the filtering techniques of the invention may be utilized in a wide variety of different types of communication applications, including communications over the Internet and other computer networks, and over cellular multimedia, satellite, wireless cable, wireless local loop, high-speed wireless access and other types of communication systems. The invention may be utilized with signals transmitted over any desired type of communication channel or channels, such as, for example, frequency channels, time slots, etc.

Figure 1:
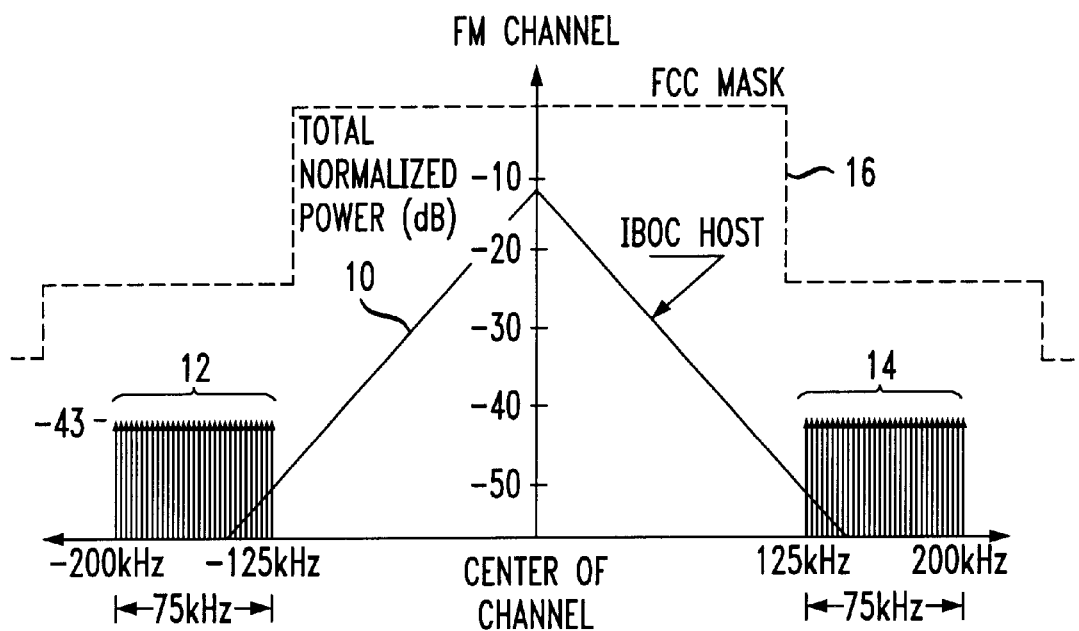
FIG. 1 shows a portion of a frequency spectrum of a frequency modulated (FM) hybrid, in-band on-channel (HIBOC) digital audio broadcasting (DAB) system.

FIG. 1 illustrates a portion of a frequency spectrum corresponding to a particular channel in an exemplary FM HIBOC DAB system. The portion of the spectrum shown includes an analog host FM signal 10 with associated lower digital sideband 12 and upper digital sideband 14. In this example, each of the sidebands is approximately 75 kHz wide, and occupies a band between 125 kHz and 200 kHz from the center of the channel. The sidebands 12 and 14 represent portions of the frequency spectrum used to transmit digital audio information in the HIBOC DAB system, and are also referred to herein as digital sidebands. As shown in FIG. 1, each of the digital sidebands 12, 14 includes a plurality of digital subcarriers, which may be, e.g., orthogonal frequency division multiplexed (OFDM) carriers. An FCC mask 16 specifies that the maximum power level of the digital sidebands 12, 14 must be at least 25 dB below the maximum power of the analog host signal 10.

The invention in the illustrative embodiments to be described below uses a bandreject filter arranged in an intermediate frequency (IF) processing stage of a digital receiver to remove a substantial portion of the analog FM host signal energy. In an FM HIBOC system such as that illustrated in FIG. 1, the average host energy is 20 to 30 dB higher than the energy in the digital sidebands.

As will be described in greater detail below, selective removal of the analog host signal energy allows automatic gain control (AGC) circuitry in the receiver to use the digital sideband signal, rather than the analog host signal, to set the dynamic range of the receiver. Allowing the digital signal to have a greater effect on the AGC setting enhances the performance of the digital demodulator in the receiver, particularly in the presence of multipath reception conditions.

Another advantage of the insertion of a bandreject filter into an IF processing stage of an IBOC receiver is that the group delay characteristics of the filter may be designed to flatten or equalize the overall IF group delay performance for the digital sidebands. This can provide substantial performance improvements for digital sideband signals that carry information in their phase state(s).

Figure 2:
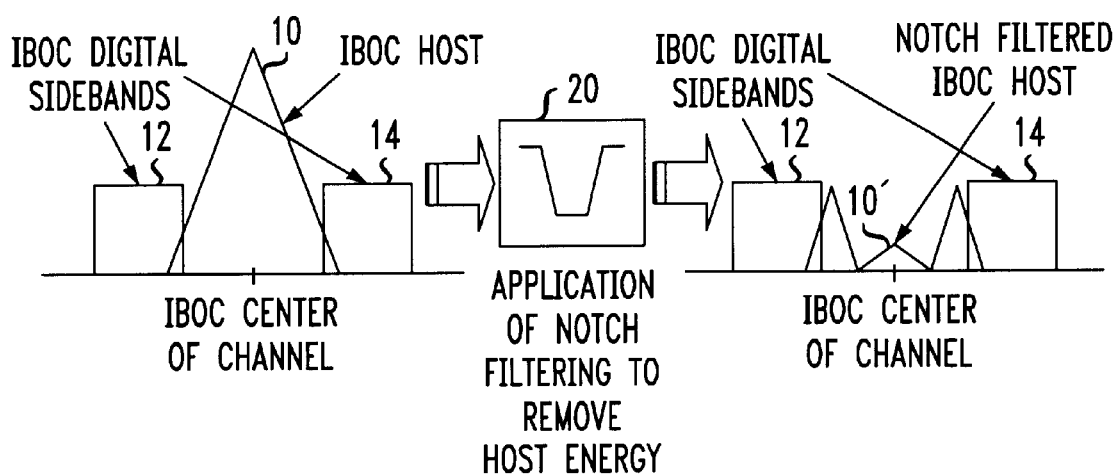
FIG. 2 illustrates the operation of an intermediate frequency (IF) analog host energy bandreject filter in accordance with the invention.

FIG. 2 illustrates the manner in which a bandreject filter 20 in accordance with the invention can substantially remove the analog host energy located between the digital sidebands 12 and 14 without removing or distorting those digital signals. The bandreject filter 20 is also referred to herein as a notch filter. Although the characteristics of filter 20 may vary depending on factors such as modulation index, source modulation type, digital sideband configuration, etc., in the illustrative embodiment it should preferably remove at least approximately 10 to 25 dB of the analog host signal energy on a time-averaged basis while attenuating the digital sidebands by less than about 2 dB. It is apparent from the figure that after the filtering operation, the analog host energy 10' is much lower than the combined energies of the digital sidebands 12 and 14. As noted previously, removal of the analog host energy facilitates demodulation of the digital sidebands 12 and 14. In accordance with the invention, the bandreject filter 20 may be implemented in one of a number of different locations in an intermediate frequency (IF) processing stage of an FM HIBOC receiver, as will be illustrated in conjunction with FIGS. 4 through 6 below.

Figure 3:
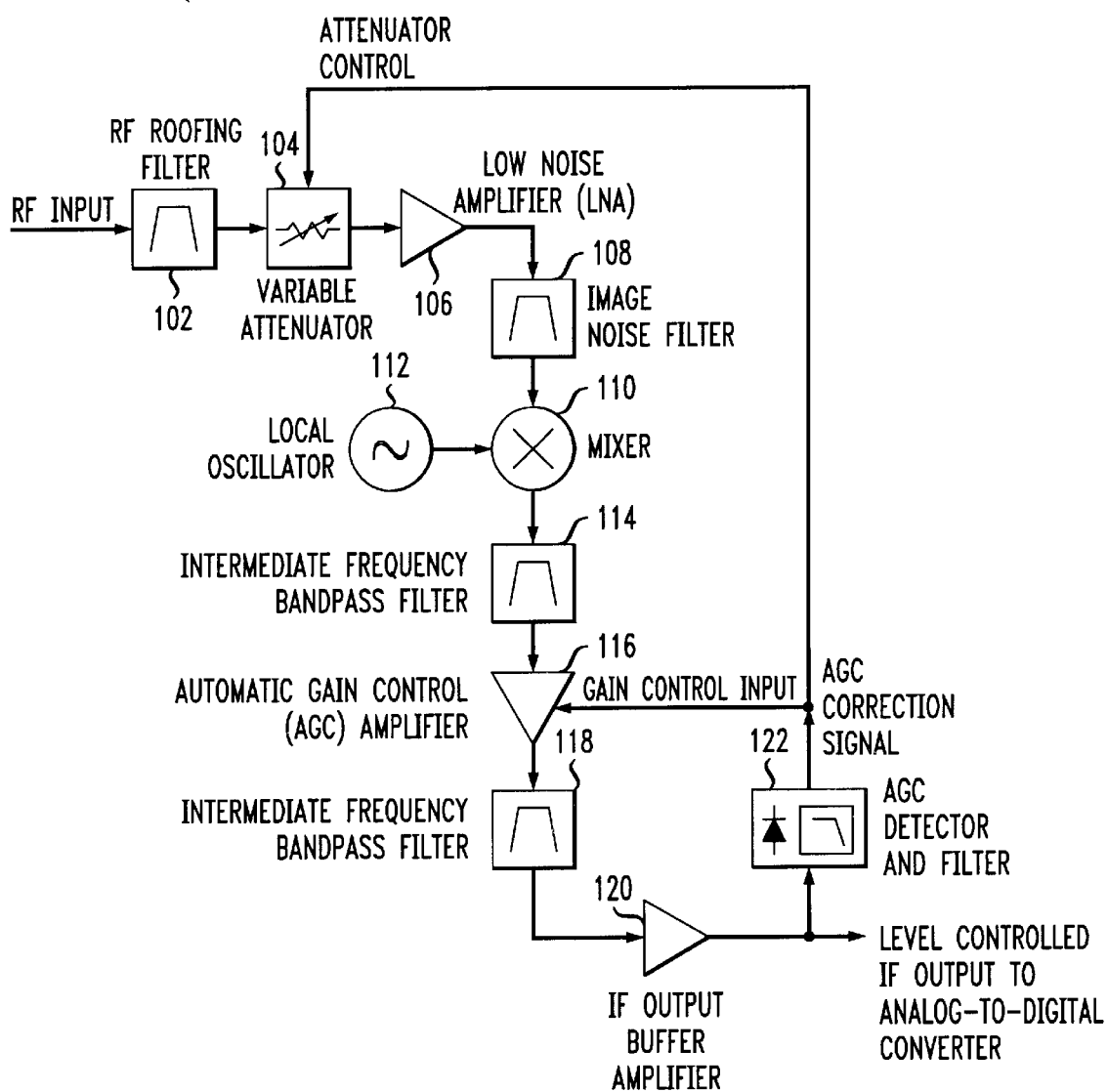
FIG. 3 shows a front end portion of an FM HIBOC receiver in which the invention may be implemented.

FIG. 3 shows an example of an RF/IF or "front end" portion of an FM HIBOC digital receiver 100 in which the above-described bandreject filter may be implemented, although the receiver 100 as shown in FIG. 3 does not include the bandreject filter. An RF processing stage of the receiver 100 includes an RF roofing bandpass filter 102, a variable attenuator 104, a low noise amplifier (LNA) 106, an image noise filter 108, a mixer 110 and a local oscillator 112. The variable attenuator provides an amount of input signal attenuation that varies in accordance with an AGC correction signal to be described below. The mixer 110 downconverts the incoming RF signal to a corresponding IF signal which is input to an IF processing stage of the receiver 100. The IF processing stage in this embodiment includes a first IF bandpass filter 114, an AGC amplifier 116, a second IF bandpass filter 118, an IF output buffer amplifier 120, and an AGC detector and filter 122. The AGC detector and filter 122 generates the above-noted AGC correction signal for application to an attenuation control input of the variable attenuator 104. The AGC correction signal is also applied to a gain control input of the AGC amplifier 116. The output of the IF output buffer amplifier represents a level-controlled IF output that may be applied to an analog-to-digital converter (ADC) in a signal processing "back end" of the receiver 100.

In the exemplary receiver 100 of FIG. 3, the entire composite FM IBOC signal as shown in FIG. 1, including both the analog host 10 and the digital sidebands 12 and 14, is processed together in the RF and IF processing stages of the receiver front end and then delivered to the ADC in the receiver back end. The AGC in the receiver front end thus operates on the sum total of the analog host and digital sideband signal energies. Given that the host power is usually dominant in this composite signal, i.e., usually containing more than 100 times the power present in the digital sideband signal, the analog host power tends to set the AGC operating point and, therefore, the output level of the composite signal supplied to the ADC.

Figure 4:
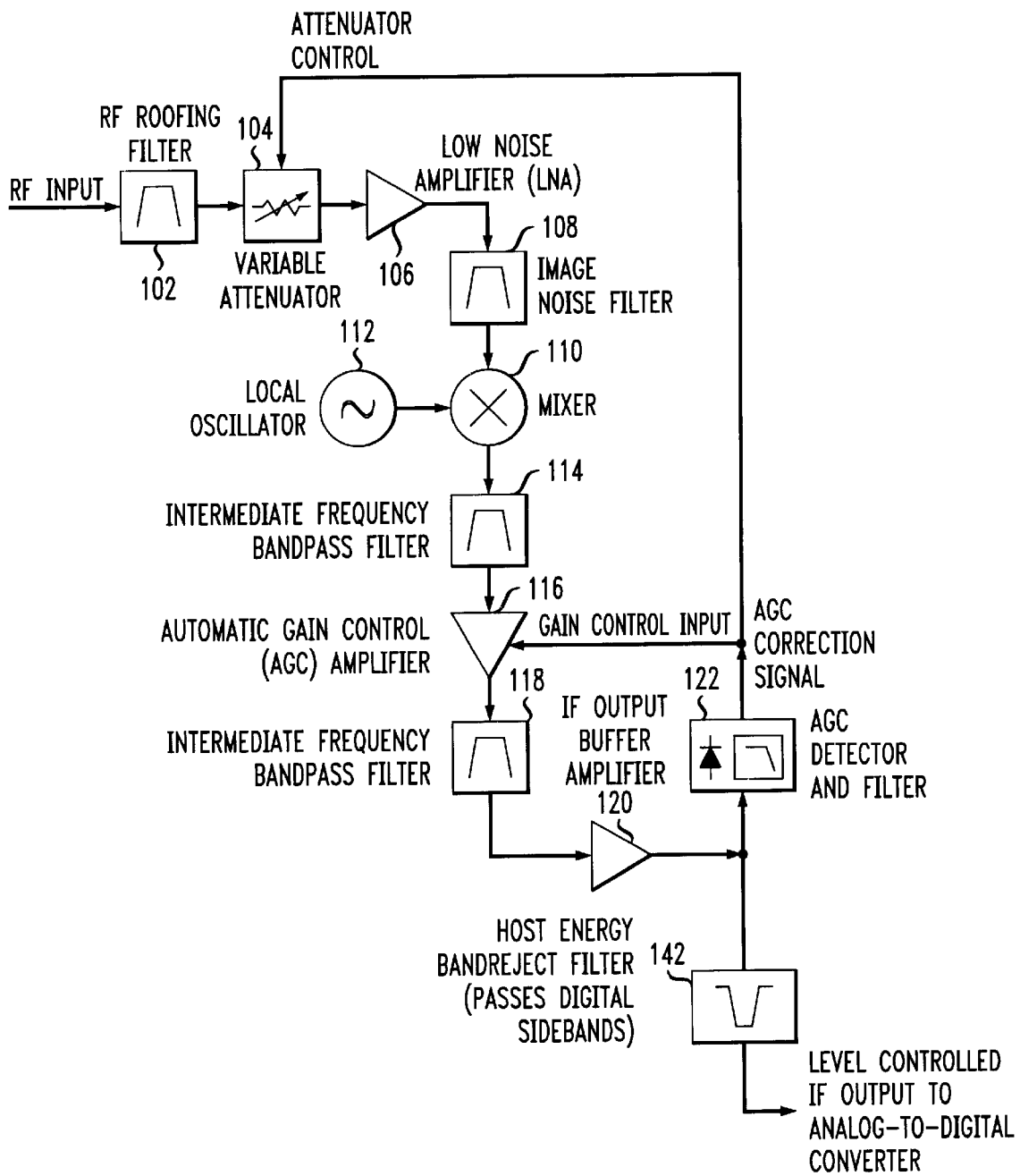
FIGS. 4, 5 and 6 show illustrative embodiments of an FM HIBOC receiver front end with IF host rejection filtering in accordance with the invention.

FIG. 4 shows a front end portion of an FM HIBOC digital receiver 140 in which a bandreject filter 142 is implemented in the IF processing stage at the output of the IF output buffer amplifier 120, after a point which drives the AGC filter and detector 122. The front end elements of the receiver 140 are otherwise the same as those described above in conjunction with FIG. 3. As in the FIG. 3 embodiment, the AGC detector and filter 122 in receiver 140 of FIG. 4 also samples both the analog host and digital sideband components of the composite FM HIBOC signal. Thus, the AGC operating point is dominated by the typically much higher power in the analog host component. However, the bandreject filter 142 placed after the IF output buffer amplifier removes a substantial portion of the analog host signal energy before the resulting filtered composite signal reaches the ADC in the receiver back end. As a result, this arrangement can significantly improve the signal-to-interference ratio of the digital signal, and can also more efficiently utilize the dynamic range of the ADC.

Figure 5:
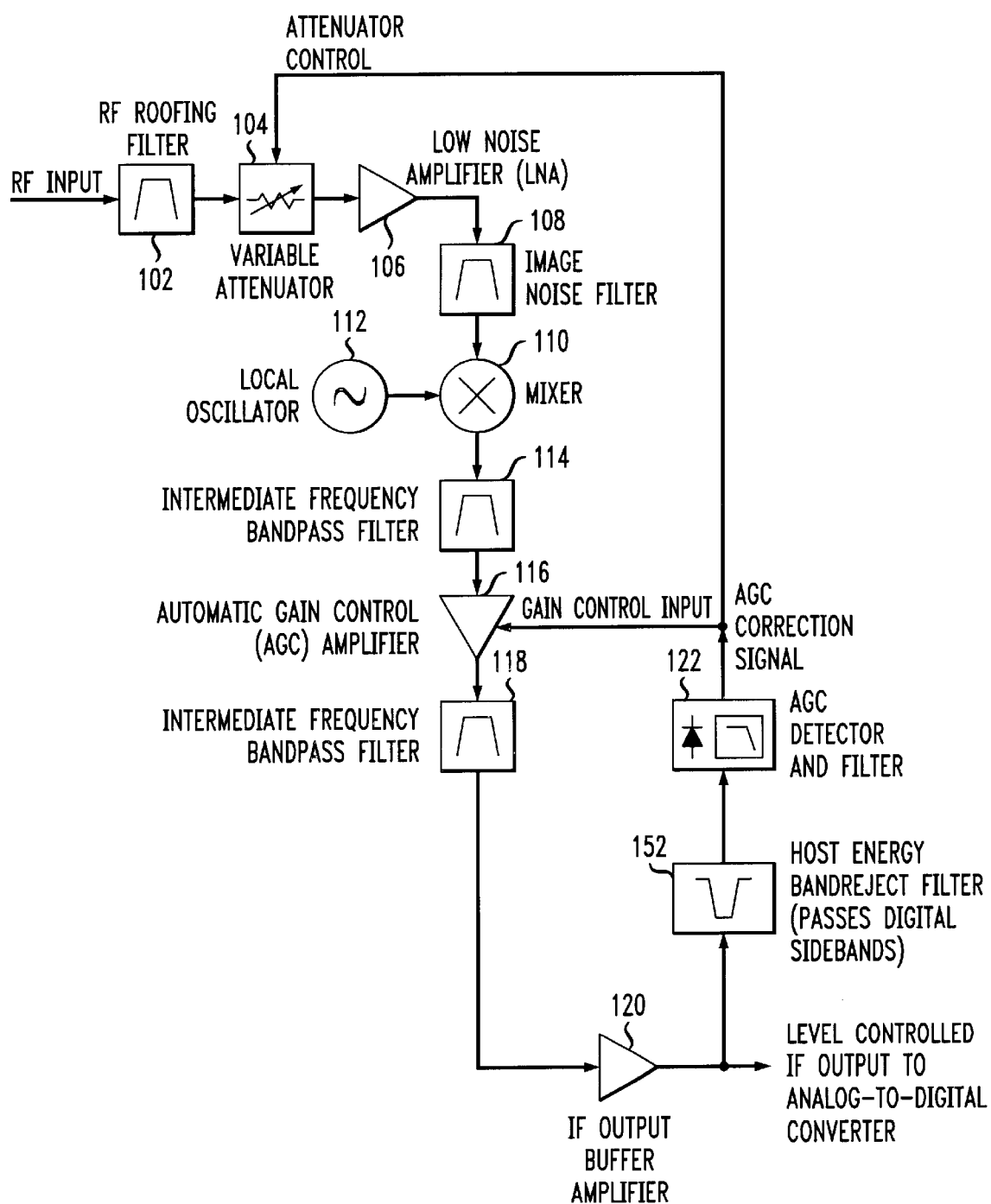

FIG. 5 shows a front end portion of an FM HIBOC digital receiver 150 in which a bandreject filter 152 is implemented in the IF processing stage between the output of the IF output buffer amplifier 120 and an input of the AGC filter and detector 122. The front end elements of the receiver 150 are otherwise the same as those described above in conjunction with FIG. 3. In this case, the bandreject filter 152 does not remove the analog host signal energy from the level-controlled IF output that is applied to the AGC in the receiver back end. However, it removes the analog host signal energy from the AGC path such that the digital signal corresponding to the digital sidebands 12, 14, rather than the analog host signal, dominates the determination of an AGC operating point in the AGC circuitry.

Figure 6:
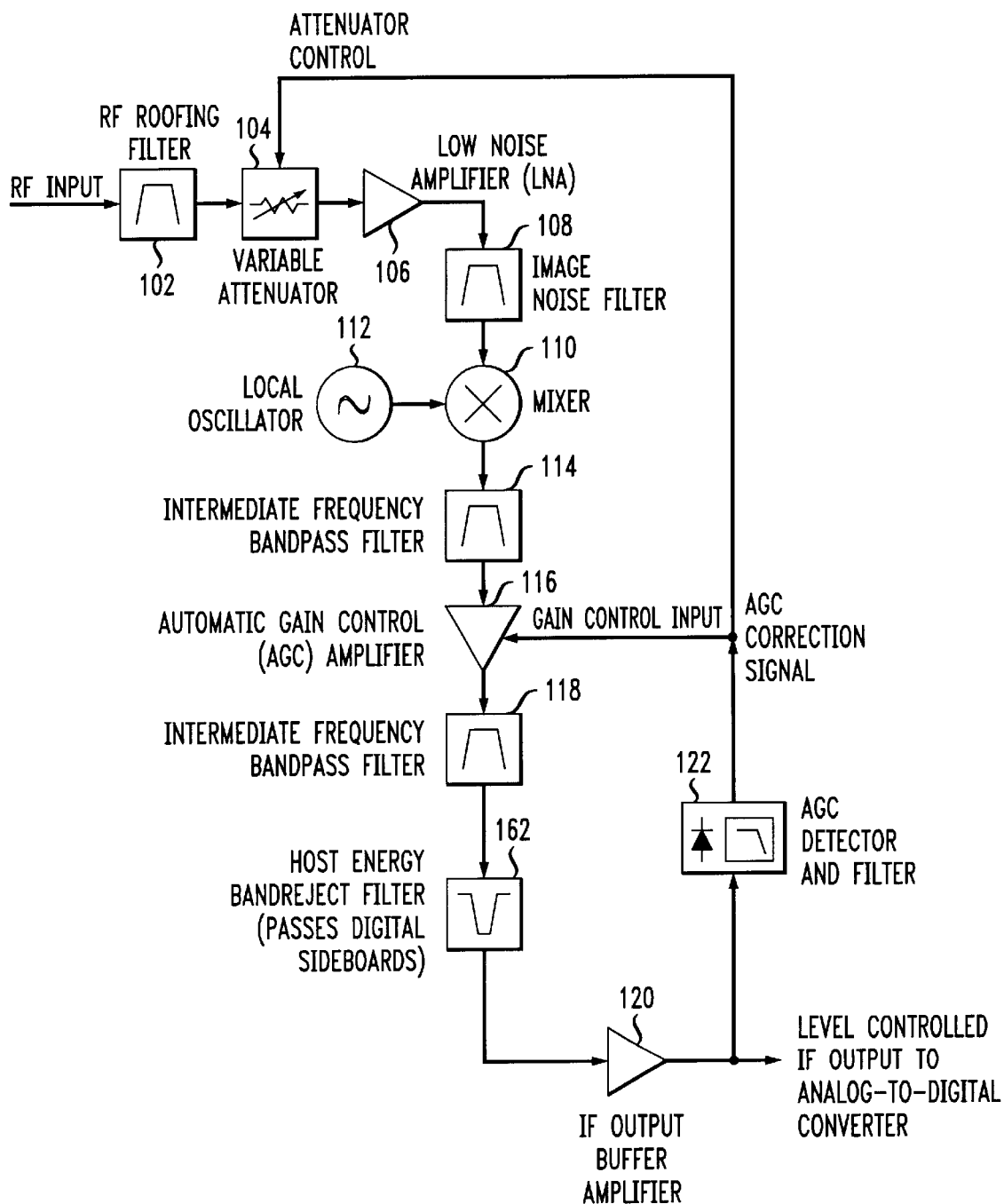

FIG. 6 shows a front end portion of an FM HIBOC digital receiver 160 in which a bandreject filter 162 is implemented in the IF processing stage between an output of the second IF bandpass filter 118 and an input of the IF output buffer amplifier 120. In this case, as in the FIG. 5 embodiment, the AGC operating point is determined primarily by the energy in the digital signal corresponding to the digital sidebands 12, 14 of the FM HIBOC composite signal. However, the placement of the bandreject filter 162 also results in suppression of the analog host signal component in the level-controlled IF output to the ADC, thereby improving signal-to-interference ratio of the digital signal and allowing the dynamic range of the ADC to be utilized more efficiently.

A result similar to that obtained in the embodiment of FIG. 6 could be obtained by placing a suitable bandreject filter in the RF processing stage of the receiver 160, prior to the mixer 110, as long as the filter is centered on the appropriate RF channel frequency. However, such an RF implementation of the bandreject filter generally must be tunable to any RF channel of interest, whereas a bandreject filter placed in the IF processing stage can be a fixed filter centered at the IF center-of-channel frequency.

The bandreject filters 20, 142, 152 and 162 in the above-described illustrative embodiments of the invention may be implemented using, e.g., lumped inductive-capacitive (LC) networks, or inductive-capacitive-resistive (LCR) networks. Such networks can be configured in a straightforward and well-known manner to provide the desired filtering characteristics described herein. The bandreject filter may be a unitized bandreject filter in which the total rejection characteristic is realized at a single point in the IF or RF processing stage, or a distributed bandreject filter in which the total rejection characteristic is realized as a cascaded transfer function of multiple band reject elements arranged at different points in one or more processing stages. These and many other suitable implementations of the bandreject filter will be readily apparent to those skilled in the art, and are therefore not further described herein.

The bandreject filter phase and amplitude characteristics may be selected to optimize a tradeoff between analog host signal rejection and distortion of the digital sidebands, and can also be used to provide frequency domain equalization of the digital sidebands.

In accordance with the invention, the bandreject filter characteristics may be adjustable based on feedback from a digital signal processing element in the receiver back end. For example, the width, attenuation and/or center frequency of the bandreject filter may be varied based on the modulation and channel transmission characteristics of the analog host signal. This may be implemented, e.g., by switching in or out sections of a multi-section bandreject filter, by adjusting the Q of one or more resonant sections of the bandreject filter, and/or by tuning of various filter components through the use of varacters, transistors, positive-intrinsic-negative (PIN) diodes, voltage variable resistors, and other well-known conventional devices.

An example of this feedback approach is illustrated in FIG. 7, which shows a portion of an FM HIBOC receiver 170 in which characteristics of a bandreject fitter 172 are controlled in accordance with feedback from a post-IF processing stage 174. The placement of the filter 172 is the same as that of filter 162 in the FIG. 6 embodiment. However, in this example the filter 172 is an electronically-controllable filter that receives a feedback signal from the post-IF processing stage 174. The feedback signal, which may be analog or digital, controls the characteristics of the bandreject filter 172 for optimum receiver performance. As previously noted, examples of controlled filter characteristics include one or more of rejection bandwidth, rejection band attenuation and center frequency. The post-IF processing stage 174 may be, e.g., a demodulation stage or other type of processing stage.

In embodiments in which a digital receiver is used for non-simultaneous demodulation of the analog host signal, a bandreject filter in accordance with the invention may be electronically removed from the signal path or suitably retuned or otherwise adjusted so as to permit reception of the analog host signal.

By substantially reducing the effect of the host signal energy on the digital receiver AGC, the invention can improve the performance of digital signal reception, particularly in the presence of multipath reception conditions. In addition, the invention reduces the need for post-ADC host rejection filtering, thereby simplifying the signal processing performance requirements in the receiver back end.

The above-described embodiments of the invention are intended to be illustrative only. For example, the embodiments illustrated in FIGS. 3–7 may be implemented using different RF and IF processing elements, in configurations other than those shown. A bandreject filter in accordance with the invention may be arranged in locations other than those shown, or in a combination of several locations, e.g., partially in an RF/IF signal path and partially in an AGC path before an AGC detector.

The invention is also applicable to other receiver architectures, such as those with multiple intermediate frequencies, in-phase/quadrature RF/IF processing or any other type of multi-phase RF/IF processing. Distributed or singular bandreject filtering may be placed, in any one, some or all of the RF/IF paths of these architectures to realize improved performance and/or reduced cost. In receiver designs having zero frequency final IF stages, e.g., a direct-conversion receiver, the bandreject filter could be realized in the zero frequency IF stage as a highpass filter.

In addition, the invention can be used with a wide variety of other types and arrangements of frequency spectra, e.g., spectra with more than two sidebands, etc., and can be applied to the reception of digital information other than audio, such as video or image information, data, or combinations of these and other types of information. Furthermore, the invention may be implemented in numerous applications other than FM HIBOC DAB systems, such as AM HIBOC DAB systems, Internet and satellite broadcasting systems, systems for simultaneous delivery of audio and data, etc. These and numerous other alternative embodiments and implementations within the scope of the following claims will be apparent to those skilled in the art.

What is claimed is:

1. A method of processing a received signal in a receiver of a communication system, the received signal including an analog host signal having one or more digital sidebands associated with, the method comprising the step of:
   filtering the analog host signal in a bandreject filter arranged at least in part in an intermediate frequency processing stage of the receiver, the bandreject filter substantially attenuating the analog host signal while passing the at least one digital sideband;
   wherein at least one filter characteristic of the bandreject filter is adjusted based on feedback from a digital signal processing element in the receiver which processes the information associated with the one or more digital sidebands.

2. The method of claim 1 wherein the bandreject filter is a unitary bandreject filter implemented at a single point in the intermediate frequency processing stage of the receiver.

3. The method of claim 1 wherein the bandreject filter is a distributed bandreject filter implemented with multiple sections at a plurality of points, at least one of the plurality of points being in the intermediate frequency stage.

4. The method of claim 1 wherein the analog host signal comprises an analog frequency modulated host signal.

5. The method of claim 1 wherein first and second digital sidebands are arranged on opposite sides of the analog host signal.

6. The method of claim 1 wherein the bandreject filter is arranged in the intermediate frequency processing stage between an output of an intermediate frequency buffer amplifier and an input of a conversion circuit, with an input of the bandreject filter coupled to a point which is between the output of the intermediate frequency buffer amplifier and the input of the conversion circuit but after a point which drives an input of an automatic gain control circuit, such that an automatic gain control operating point is determined primarily by the analog host signal.

7. The method of claim 1 wherein the bandreject filter is arranged in the intermediate frequency processing stage between an output of an intermediate frequency buffer amplifier and an input of an automatic gain control circuit, such that an automatic gain control operating point is determined primarily by the one or more digital sidebands.

8. The method of claim 1 wherein the bandreject filter is arranged in the intermediate frequency processing stage between an output of an intermediate frequency bandpass filter and an input of an intermediate frequency buffer amplifier, such that an automatic gain control operating point is determined primarily by the one or more digital sidebands.

9. The method of claim 1 wherein the bandreject filter maybe selectively adjusted to permit reception of the analog host signal.

10. A method of processing a received signal in a receiver of a communication system, the received signal including an analog host signal having one or more digital sidebands associated with, the method comprising the step of:
    filtering the analog host signal in a bandreject filter arranged at least in part in an intermediate frequency processing stage of the receiver, the bandreject filter substantially attenuating the analog host signal while passing the at least one digital sideband;
    wherein the bandreject filter has a group delay characteristic for a portion of a frequency spectrum associated with the one or more digital sidebands that is selected to equalize at least a portion of a group delay characteristic for a corresponding portion of the frequency spectrum in a signal path of the receiver in which the bandreject filter is arranged.

11. An apparatus for processing a received signal in a communication system, the received signal including an analog host signal having one or more digital sidebands associated therewith, the apparatus comprising:
    a receiver including a bandreject filter arranged at least in part in an intermediate frequency processing stage of the receiver, the bandreject filter substantially attenuating the analog host signal while passing the at least one digital sideband;
    wherein at least one filter characteristic of the bandreject filter is adjusted based on feedback from a digital signal processing element in the receiver which processes the information associated with the one or more digital sidebands.

12. The apparatus of claim 11 wherein the bandreject filter is a unitary bandreject filter implemented at a single point in the intermediate frequency processing stage of the receiver.

13. The apparatus of claim 11 wherein the bandreject filter is a distributed bandreject filter implemented with multiple sections at a plurality of points, at least one of the plurality of points being in the intermediate frequency stage.

14. The apparatus of claim 11 wherein the analog host signal comprises an analog frequency modulated host signal.

15. The apparatus of claim 11 wherein first and second digital sidebands are arranged on opposite sides of the analog host signal.

16. The apparatus of claim 11 wherein the bandreject filter is arranged in the intermediate frequency processing stage between an output of an intermediate frequency buffer amplifier and an input of a conversion circuit, with an input of the bandreject filter coupled to a point which is between the output of the intermediate frequency buffer amplifier and the input of the conversion circuit but after a point which drives an input of an automatic gain control circuit, such that an automatic gain control operating point is determined primarily by the analog host signal.

17. The apparatus of claim 11 wherein the bandreject filter is arranged in the intermediate frequency processing stage between an output of an intermediate frequency buffer amplifier and an input of an automatic gain control circuit, such that an automatic gain control operating point is determined primarily by the one or more digital sidebands.

18. The apparatus of claim 11 wherein the bandreject filter is arranged in the intermediate frequency processing stage between an output of an intermediate frequency bandpass filter and an input of an intermediate frequency buffer amplifier, such that an automatic gain control operating point is determined primarily by the one or more digital sidebands.

19. The apparatus of claim 11 wherein the bandreject filter may be selectively adjusted to permit reception of the analog host signal.

20. An apparatus for processing a received signal in a communication system, the received signal including an analog host signal having one or more digital sidebands associated therewith, the apparatus comprising:

a receiver including a bandreject filter arranged at least in part in an intermediate frequency processing stage of the receiver, the bandreject filter substantially attenuating the analog host signal while passing the at least one digital sideband;

wherein the bandreject filter has a group delay characteristic for a portion of a frequency spectrum associated with the one or more digital sidebands that is selected to equalize at least a portion of a group delay characteristic for a corresponding portion of the frequency spectrum in a signal path of the receiver in which the bandreject filter is arranged.

* * * * *